United States Patent
Pelc et al.

(10) Patent No.: US 6,810,110 B2
(45) Date of Patent: Oct. 26, 2004

(54) X-RAY TUBE FOR OPERATING IN A MAGNETIC FIELD

(75) Inventors: Norbert J. Pelc, Los Altos, CA (US); Zhifei Wen, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 141 days.

(21) Appl. No.: 10/306,791

(22) Filed: Nov. 27, 2002

(65) Prior Publication Data

US 2003/0123612 A1 Jul. 3, 2003

Related U.S. Application Data

(63) Continuation-in-part of application No. 09/823,889, filed on Mar. 30, 2001.
(60) Provisional application No. 60/193,731, filed on Mar. 30, 2000, and provisional application No. 60/193,735, filed on Mar. 30, 2000.

(51) Int. Cl.$^7$ ............................................. H01J 35/14
(52) U.S. Cl. ...................................... 378/138; 378/119
(58) Field of Search ........................... 378/63, 119, 121, 378/137, 138, 205; 600/410, 411

(56) References Cited

U.S. PATENT DOCUMENTS

| | | | |
|---|---|---|---|
| 5,713,357 A | * 2/1998 | Meulenbrugge et al. | 600/411 |
| 5,757,118 A | 5/1998 | Kubo | 313/365 |
| 5,818,901 A | 10/1998 | Schulz | 378/63 |
| 6,031,888 A | 2/2000 | Ivan et al. | 378/20 |
| 6,101,239 A | 8/2000 | Kawasaki et al. | 378/63 |
| 6,151,384 A | 11/2000 | Reed et al. | 378/138 |
| 6,259,765 B1 | * 7/2001 | Baptist | 378/136 |
| 6,658,085 B2 | * 12/2003 | Sklebitz | 378/63 |

OTHER PUBLICATIONS

F, D. Becchetti et al., "Magnetic confinement of radio-therapy beam–dose profiles," Cyclotrons and Their Applications 2001, Sixteenth International Conference (AIP Press) pp. 44–46.

Dale W Litzenberg et al., "An apparatus for applying strong longitudinal magnetic fields to clinical photon and electron beams," Phys Med Bio V46 No. 5, pp. N105–N115, (2001).

Frederick D. Becchetti et al., "High energy electron beams shaped with applied magnetic fields could provide a competitive and cost–effective alternative to proton and heavy-–ion radiotherapy," Med Phys 29 (10), Oct. 2002, pp. 2435–2437.

* cited by examiner

Primary Examiner—Edward J. Glick
Assistant Examiner—Courtney Thomas
(74) Attorney, Agent, or Firm—Lumen Intellectual Property Services Inc.

(57) ABSTRACT

An x-ray tube having sensors, magnets, and/or active compensation means operatively coupled thereto or integrated therein for aligning its electron beam with an external magnetic field. Permanent magnets positioned behind the anode and cathode respectively or electromagnets are used to produce a strong, properly aligned internal magnetic field. The x-ray tube is thus less sensitive to other magnetic fields that are not parallel to the anode-cathode axis. The x-ray tube can be mounted in a manner that it can pivot, allowing it to move and align itself. The x-ray tube can also be mounted such that a torque can be sensed. This sensed mechanical force is then used as an input to determine current applied to electromagnetic coils arranged to oppose a transverse magnetic field.

24 Claims, 4 Drawing Sheets

X-RAY TUBE FOR OPERATING IN A MAGNETIC FIELD

CROSS-REFERENCE TO RELATED APPLICATIONS

This is a continuation-in-part application of a U.S. patent application Ser. No. 09/823,889, filed Mar. 30, 2001, which is hereby incorporated herein by reference and which claims the benefit of U.S. provisional patent application Nos. 60/193,731 and 60/193,735, both filed Mar. 30, 2000. This application also relates to co-pending U.S. patent application Ser. No. 10/259,225, filed Sep. 26, 2002, which is hereby incorporated herein by reference.

STATEMENT REGARDING FEDERALLY SPONSORED RESEARCH OR DEVELOPMENT

This invention was supported in part by grant number P41 RR09784 from the National Institutes of Health (NIH). The U.S. Government has certain rights in the invention.

FIELD OF THE INVENTION

This invention relates generally to an x-ray tube operating in a magnetic field. More particularly, it relates to an x-ray tube having sensors, internal magnets, and/or active compensation means operatively coupled thereto or integrated therein for aligning the cathode-anode axis of the x-ray tube with a magnetic field.

BACKGROUND ART

Magnetic resonance imaging (MRI) and x-ray fluoroscopic imaging are important imaging tools. For example, in medical imaging they are routinely used for diagnosing diseases and for image-guided interventional procedures. Each method provides its own advantages: MRI provides excellent soft tissue contrast, three-dimensional visualization, physiological information, and the ability to image in any scan plane, while x-ray imaging offers much higher spatial and temporal resolution in a projection format, useful for visualization and placement of guidewires, catheters, stents, and other medical devices. Combining the two imaging systems therefore offers significant benefits over using each system alone. Currently, several approaches are used for combining the systems. In one, an x-ray fluoroscope is located in a room adjacent to the MRI system. In another, the x-ray and MRI systems are in the same room, but the patient must be moved out of the magnetic field to be imaged by the x-ray system. Moving the patient is undesirable, because it is time consuming, possibly dangerous, and can render the images inconsistent. Therefore, one wants to minimize the distance between the two systems, and perhaps overlap them. This will place critical components of the x-ray system within a high magnetic field.

The ideal system is one in which x-ray imaging and magnetic resonance imaging can be performed in the same location, eliminating the need to move the patient. Before a combined MRI and x-ray system can be constructed, however, the individual systems must be modified to ensure that the high magnetic field of the MRI system does not affect the x-ray system, and that the x-ray system does not disturb the operation of the MRI system. For example, conventional x-ray fluoroscopy detectors are image intensifiers, which are exceedingly sensitive to magnetic fields and therefore cannot be used near, let alone inside, an MRI system. However, flat panel x-ray detectors that are relatively immune to magnetic field effects are now available.

A major obstacle to combining MRI and x-ray systems is the x-ray source, which consists of an x-ray tube and its housing. X-rays are generated using an x-ray tube, in which electrons are accelerated from a heated cathode to an anode by a very high potential (e.g., 50 to 150 kV). Interactions between the high energy electrons of the beam and atoms of the anode target material cause deceleration of the electrons and production of x-ray photons.

FIG. 1 is a schematic diagram of a fixed anode x-ray tube 10 of the prior art. The tube 10 is evacuated and contains a tungsten filament cathode 12 and a more massive anode 14, typically a copper block 16 with a metal target 18 plated on or embedded in the copper surface. The target 18 is most often tungsten, but other metals can be used, such as molybdenum, rhodium, silver, iron, or cobalt. Separate circuits are used to heat the filament 12 and to accelerate the electrons to the target 18. The accelerating potential determines the spectrum of wavelengths (or photon energies) of the emitted x-rays. A high voltage is connected between the cathode 12 and anode 18 to provide the accelerating potential. Typically, the anode and cathode voltages are maintained at plus and minus half of the total accelerating voltage, respectively. X-rays generated at the target 18 exit the tube 10 through an x-ray transparent window 20 and are directed toward the object being imaged.

When an x-ray tube is operated within or near an MRI system, it experiences the static magnetic field $B_o$, as illustrated schematically in FIG. 2. The magnetic field at the location of the x-ray tube exerts a force on moving electrons and may deflect or defocus the electron beam. The force on an electron is proportional to the cross-product of the velocity of the electron and the magnetic field; that is, only the velocity component that is perpendicular to the magnetic field is perturbed. This will alter the direction of the electron motion, thereby making the direction of the deflecting force time-dependent. In the example of FIG. 2, the electrons are emitted from the cathode with some initial velocity and are accelerated toward the anode by the electric field E. The macroscopic result of the time-dependent force is to produce a deflection away from what would be observed without $B_o$ present, with a deflection in the direction of $B_o$, and an additional deflection of the beam $v_{\perp drift}$ in a direction perpendicular to both $B_o$ and the electric field E. Because the ideal electron velocity is in the direction of the target, as is due to the acceleration caused by the electric field, unless the magnetic field is parallel to the electric field, it will deflect the electrons away from the center of the target, possibly causing them to miss the target entirely. Thus the effect of the static magnetic field of the MRI system on the x-ray tube can be highly undesirable and may damage the tube if it is operated under non-ideal conditions, or it may lower the x-ray intensity to a level that is unacceptable. In the combined system, it is not desirable—indeed it may be impossible—to turn off the static magnetic field before acquiring x-ray images, and so the effect of the magnetic field on the x-ray tube must be addressed.

A number of combined magnetic resonance imaging and x-ray imaging systems are disclosed in the prior art. U.S. Pat. No. 5,713,357, issued to Meulenbrugge et al., discloses a combined system that minimizes or eliminates the distance an object being imaged must be displaced between individual systems. In one embodiment, the object is displaced a small distance along a track between adjacent MRI and x-ray imaging systems with non-coincident fields of view. In another embodiment, the object is not moved and the fields of view of the two systems are coincident, but the x-ray imaging system is moved out of the MRI field of view during MR image acquisition. During x-ray imaging, the x-ray source is either out of range of the static magnetic field, passively shielded from the magnetic field, or positioned so that the electron beam is parallel to the magnetic field. In this alignment, the electron beam should not be deflected by the magnetic field. This technique, however, limits the system in that the x-ray tube must remain fixed at a certain orientation and/or distance with respect to the static magnet. Moreover, Meulenbrugge et al.'s invention does not teach or suggest how to control/maintain the alignment of the electric and magnetic fields in the x-ray tube.

U.S. Pat. No. 6,151,384, issued to Reed et al, describes an x-ray tube that uses a curved magnetic field to steer electrons toward the anode. This tube cannot be used for imaging since it has multiple, relatively large anode targets that produce x-rays. Further, since Reed et al's magnetic field is curved, their method will not work well when the source is placed in an environment with a strong external field, such as in the neighborhood of an MRI system.

U.S. Pat. No. 5,818,901, issued to Shulz, discloses a combined system with simultaneous MR and x-ray imaging and coincident fields of view. A solid state x-ray detector containing amorphous hydrated silicon, which is not affected by the magnetic field, is used in place of an image intensifier. The x-ray source is positioned far enough from the MR apparatus that the influence of the magnetic field on the x-ray source is slight. Additionally, the influence is reduced further by surrounding the source with a cladding material that shields the source from the magnetic field. The goal of the cladding or shielding is to reduce the magnetic field at the location of the x-ray source to a level where it can be tolerated.

U.S. Pat. No. 6,031,888, issued to Ivan et al., discloses an x-ray fluoroscopy assist feature for a diagnostic imaging device such as MRI or computerized tomography (CT). X-rays are generated using a rotating anode x-ray tube. There is no mention of the effects of the magnetic field on the x-ray source or of any methods to eliminate such effects.

A medical imaging apparatus containing both x-ray radiographic means and MRI means is disclosed in U.S. Pat. No. 6,101,239, issued to Kawasaki et al. The x-ray and MRM systems have coincident fields of view, and the timing of the image acquisition is controlled so that the x-ray pulses occur only when the gradient magnetic fields and RF magnetic fields of the MRI system arc off. There is no mention of minimizing or eliminating the effect of the static magnetic field on the x-ray source.

These prior art references offer two solutions to the problem of electron beam deflection in the x-ray tube by the static magnetic field of the MRI system: shielding the tube or aligning the electron beam with the magnetic field. Sufficient cladding to completely eliminate the effect of the magnetic field on the electron beam may not be feasible. Aligning the tube with the magnetic field also has potential problems including that the type and/or the placement of the x-ray tube may be limited and that it may be difficult to rotate the x-ray tube to different orientations around the patient. X-ray tube inserts typically have components that distort the magnetic field and pose additional difficulties. More importantly, since such alignment has a very small tolerance, it is critically difficult to attain.

Use of correcting magnetic fields in imaging systems is known. For example, in the context of x-ray image intensifiers, U.S. Pat. No. 5,757,118, issued to Kubo, uses a correcting electromagnetic coil placed inside a cylindrical magnetic shield surrounding an x-ray image intensifier tube apparatus in combination with a ferromagnetic thin plate placed in front of a convex input window of the tube to produce an internal magnetic field which allows the removal of the rotational distortion and S-shaped distortion of an output image resulting from an external magnetic field that reaches a region inside the input window. Specifically, a direct current is applied to the electromagnetic coil so that a magnetic field is produced in the direction opposite to, and thus cancels part of, the external magnetic field. Kubo does not teach or suggest how to maintain/control the alignment of electric and magnetic fields. There remains, therefore, a need to control the alignment between electric and magnetic fields.

SUMMARY

The present invention addresses this need by providing an x-ray source that can be operated in the presence of a high magnetic field without being inadvertently affected thereby. The x-ray source comprises an x-ray tube having a cathode and an anode and a magnetic means that is produces a magnetic field having magnetic field lines passing from the cathode to the anode to compensate or correct an otherwise undesired magnetic field. Exemplary magnetic means includes an electromagnet or permanent magnets. The electromagnet may be electromagnetic windings or coils, which may be mechanically coupled to the x-ray tube. The permanent magnets may be integrated inside or positioned outside of the x-ray tube.

In an embodiment, permanent magnets are respectively placed behind the anode and the cathode to create a strong magnetic field between the anode and the cathode, hereinafter referred to as the internal magnetic field. In another embodiment, a strong magnetic field is similarly produced by an electromagnetic winding such as a solenoid coil inside or around the x-ray tube. Since the strength of this internal magnetic field is sufficiently strong enough to outweigh the effects of the external field, the x-ray tube so modified is less sensitive to other magnetic fields that are not parallel to the anode-cathode axis.

If the x-ray tube is operating in the presence of an external magnetic field, especially one that is comparable to or stronger than the internal magnetic field generated therein and the internal magnetic field is not aligned with the external magnetic field, the x-ray tube will experience a torque that attempts to align the x-ray tube with the external magnetic field. One embodiment of the present invention solves this problem with a novel mounting arrangement to allow the x-ray tube to align itself with the external magnetic field. Ideally, the mounting of the x-ray tube within the x-ray source housing allows the x-ray tube to pivot about the focal spot, thereby maintaining the alignment of the x-ray focal spot within the x-ray system.

In some cases, it may not be possible to let the x-ray tube rotate into full alignment. The x-ray tube in these cases, according to an aspect of the invention, should be mounted in such a way that the torque it experiences, or at least the direction of the torque, can be sensed. This sensed mechanical force can then be used as an input to determine the amount of current to be applied to the electromagnetic coils arranged to oppose the transverse field. The x-ray tube experiences no torque when the transverse field is zero. When a torque is sensed, the current supplied to the electromagnetic coils is altered in a way to oppose the torque. This feedback process, which can operate essentially in real time, ideally continues until the sensed torque is effectively zero.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The present invention provides a novel x-ray tube for use in an external magnetic field. The x-ray tube contains one of a variety of inventive devices for steering the electron beam towards the anode target of the x-ray tube. As a result, deflection of the electron beam by the external magnetic field is minimized.

Figure 3:
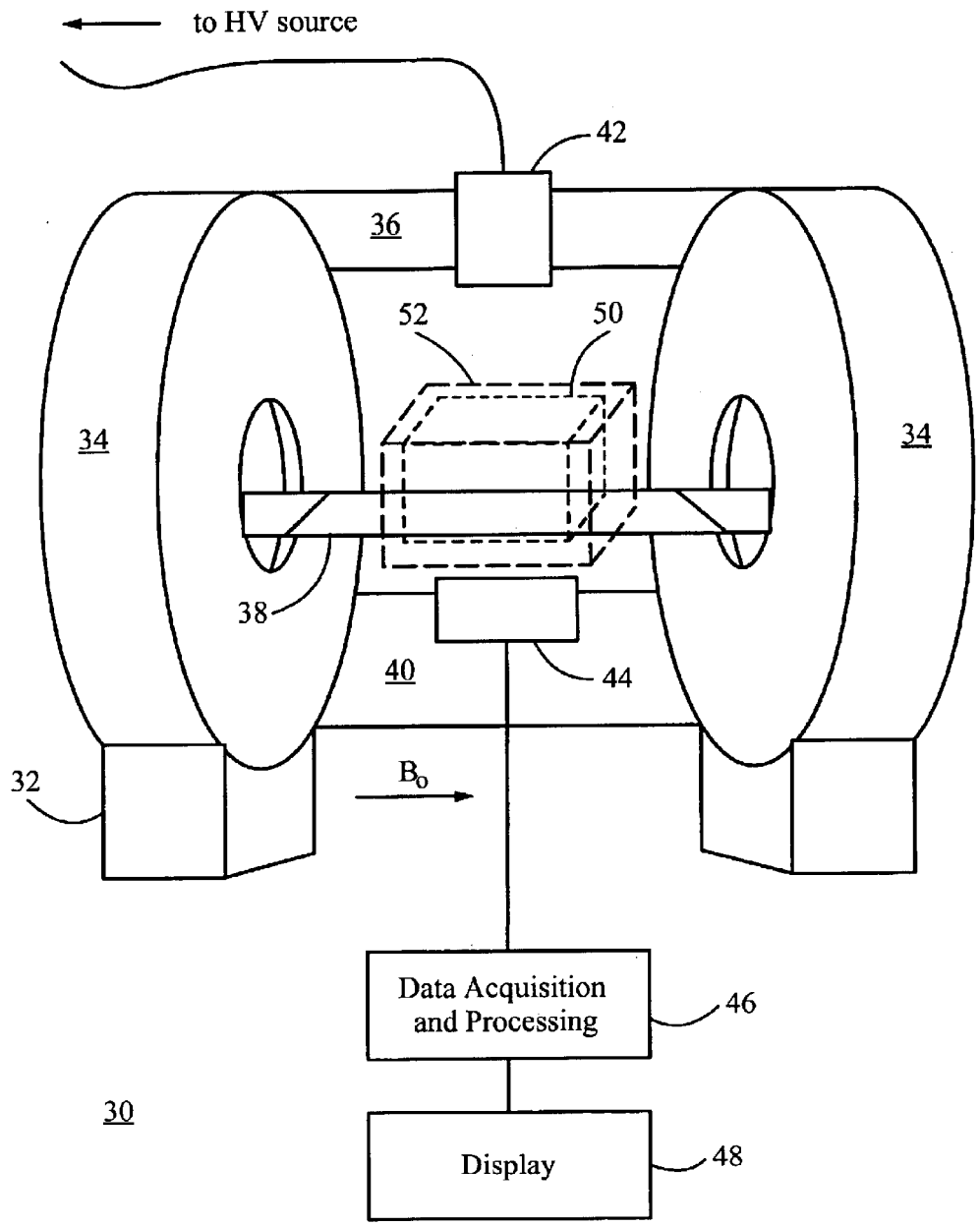
FIG. 3 is a schematic diagram of an imaging apparatus of the present invention.

FIG. 3 is a schematic diagram of an imaging apparatus 30 according to the present invention. As shown, the apparatus 30 contains a standard open-bore double-donut interventional MRI unit 32 containing magnets 34, an upper horizontal enclosure 36, a patient support 38, and a bridge 40 below the patient support 38. The magnets 34 provide a static or main magnetic field $B_o$ in the direction of the arrow. Not shown are standard additional elements such as gradient coils, gradient amplifiers, radio frequency (RF) coils, RF transmitters, MRI data acquisition and processing electronics, and a display. Added to MRI unit 32 are the elements of an x-ray fluoroscopy system: an x-ray source 42, a high voltage generator (not shown), an x-ray detector 44, a detector power supply (not shown), x-ray data acquisition and processing electronics 46, and a display 48. The x-ray source 42 is contained within the upper horizontal enclosure 36, and the x-ray detector 44 is positioned in the bridge 40 below the patient support 38. This positioning provides adequate distances between the x-ray source 42 and the object and between the source 42 and the x-ray detector 44; for example, in a commercial interventional device, the distances are 75 cm and 90 cm, respectively. The patient support 38 is transparent to x-rays.

The orientation of the x-ray system components shown in FIG. 3 provides x-ray imaging in a vertical projection. The x-ray field of view (FOV) is shown by the dotted lined box designated by the reference character 50. X-ray images can be acquired of objects within the x-ray FOV 50. Similarly, the MRI field of view is shown by the dashed box designated by the reference character 52. MR images can be acquired of objects within the MRI FOV 52. The two fields of view are referred to herein as substantially coincident when their intersection contains a majority of at least one of the two fields of view. Alternatively, the FOVs can be thought of as substantially coincident when a region of interest of an imaged object can be imaged by both systems without moving the object. Of course, it is not necessary that the x-ray components be positioned as shown in FIG. 3 to provide coincident fields of view. Any suitable positioning of the x-ray components is within the scope of the present invention. For example, it may be desired to acquire x-ray images at different projections, in which case the x-ray source 42 and x-ray detector 44 are mounted on a rotatable support. The invention can also be implemented with a closed bore MRI system, with the x-ray components situated appropriately.

Further, although coincident fields of view is highly desirable, the present invention can be practiced with systems in which the fields of view are not coincident. In fact, when the x-ray tube is not within the bore of the MRI system, the magnetic field is much less controlled than it is within the bore. In this case, it is very difficult to align the desired direction of travel of the electron beam with the magnetic field, and the present invention is particularly useful.

In a simple implementation, the individual modalities (i.e., MRI and x-ray) of the apparatus 30 are not active simultaneously, i.e., MR images and x-ray images are not acquired simultaneously, to minimize the detrimental effect of each system on the other. RF interference by the x-ray system on the MRI system is minimized by powering down the x-ray system before acquiring MR images. When x-ray images are acquired, only the main magnetic field of the MRI system is present; other elements, such as the magnetic field gradients and RF magnetic fields, are inactive. However, systems that are capable of simultaneous x-ray and MR imaging are also within the scope of the present invention.

Figure 1:
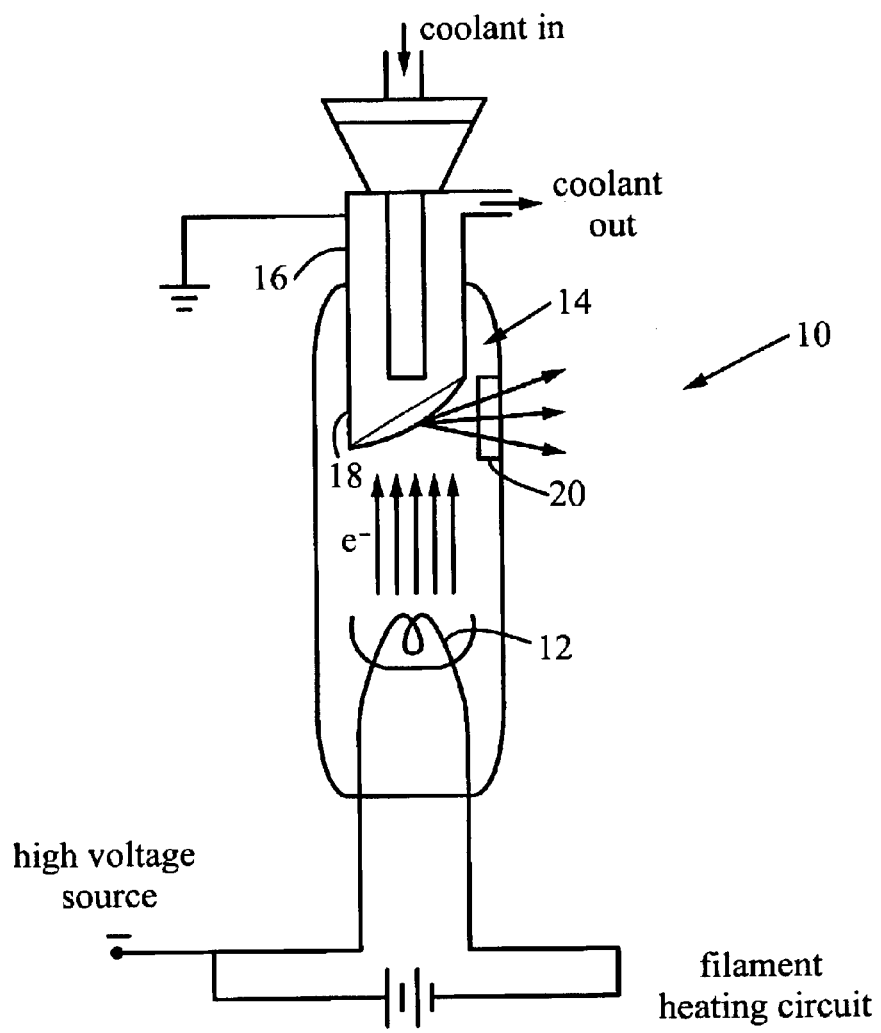
FIG. 1 is a schematic diagram of a prior art x-ray tube.
Figure 2:
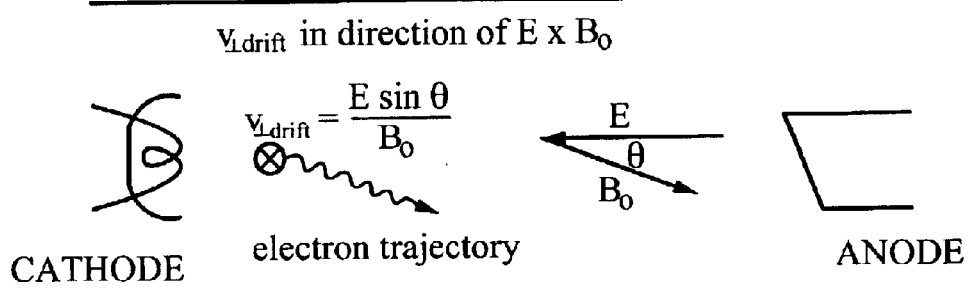
FIG. 2 is a schematic diagram showing the deflection of an electron beam in a magnetic field, as known in the prior art.

Note that only the x-ray source 42 and x-ray detector 44 must be placed in the static magnetic field. The high voltage power supply and its control (often referred to as the x-ray generator) and the data acquisition and processing electronics 46 and display 48 are preferably located outside of the static magnetic field and connected to the source and detector by shielded cables or fiber-optic coupling. The high voltage source provides both the accelerating voltage between the cathode and anode and the current for heating the cathode filament (see FIG. 1). In systems with a fragile x-ray tube filament, heating the filament with AC power can cause it to break in a magnetic field from mechanical vibration. If desired, the filament power supply in the generator can be modified to rectify and filter the filament power. However, in experiments performed by the present inventors, rectifying the power was unnecessary in at least one tube operated with high frequency AC power.

The x-ray detector 44 is preferably a solid state flat panel detector containing a phosphor conversion layer such as CsI coupled to an amorphous silicon panel having an array of photodiodes and readout electronics. The phosphor layer converts x-ray radiation into visible light, and the photodetectors generate electric signals from the visible light. Such detectors are commercially available. An alternative choice is a flat panel detector coupled to a so-called "direct conversion" photoconducting layer such as amorphous selenium. Charge carriers produced by the x-rays in the photoconductor are swept by an electric field across the converter and read out by the pixel electronics in the flat panel detector. Detectors using CCD devices can also be used.

The x-ray source 42 contains an x-ray tube, a collimator, and a housing. The x-ray tube is preferably a stationary anode x-ray tube. Most x-ray tubes in diagnostic x-ray imaging systems have rotating anodes, which allow high exposure rates without target vaporization. Induction motors used to spin the anode may be significantly affected by the external field, and may distort the magnetic field of the MRI system. Fixed anode tubes provide lower, but still sufficient, intensity, particularly for long, low-dose fluoroscopic exposures and for radiographic exposures, and are compatible with the magnetic field. Use of rotating anode tubes may be feasible, however, especially if non-magnetic means are used to drive the anode rotation. Magnetic components within a standard x-ray tube are replaced with equivalent non-magnetic components, e.g., stainless steel components. The x-ray source housing is typically comprised of lead, brass, and aluminum, all non-magnetic materials. The tube and housing are preferably cooled by passive convection of oil and air, respectively, but actively cooled components are also possible.

As discussed above, the static magnetic field $B_o$ deflects the electron beam of the x-ray source unless the direction of travel is parallel to $B_o$. The present invention provides various additions to the x-ray source that steer the electron beam onto the anode target. The focal spot of an x-ray tube is characterized by the size and location of the focal spot on the target. Typical focal spot sizes for stationary anode x-ray tubes are on the order of 1 mm by 10 mm. In the present invention, the certainty about the location of the focal spot is improved over that which would occur in the presence of a misaligned magnetic field (i.e., magnetic and electric fields that are not co-aligned) when the additional steering provided by the present invention is not implemented. As a result of the present invention, the focal spot is located closer to the desired location on the x-ray tube target.

Preferably, the x-ray tube is positioned so that its electron beam is substantially parallel to the static magnetic field, i.e., so that the angle between the two is less than 15°, to minimize the work required to steer the electron beam onto the target. However, in some systems the misalignment between the direction of the external magnetic field and the desired direction of travel may be substantial.

Note that because the magnetic force is perpendicular to the electron velocity, the electron moves in a spiral trajectory if the magnetic field is not identically parallel to the electron velocity. Provided that the radius is small enough, the effect of the magnetic field is a slight change of the focal spot shape on the anode target. Some amount of broadening and other changes are acceptable, and therefore it is not necessary that the electrons travel in a perfectly straight line from cathode to anode.

Figure 4:
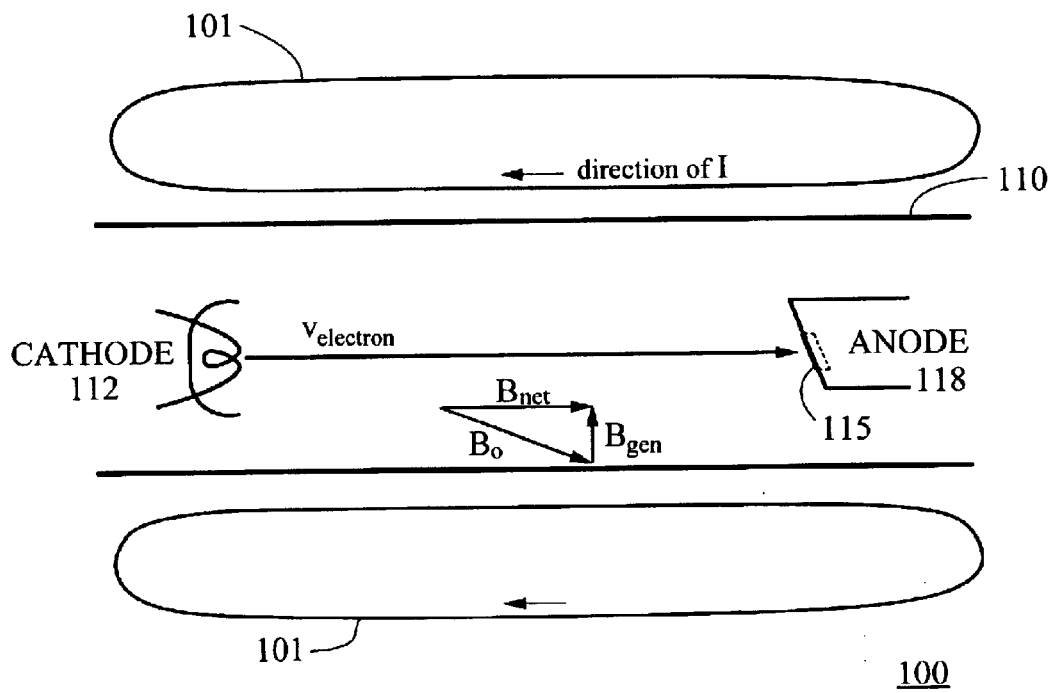
FIG. 4 is a schematic diagram of an x-ray source of the apparatus of FIG. 3.

FIG. 4 shows an x-ray source 100 comprising a magnetic field generating means such as electromagnetic coils to counteract unwanted magnetic fields that are transverse to the anode-cathode direction. In this apparatus, the electron beam is steered towards the target anode 118 using electromagnetic coils 101 positioned around the outside of an x-ray tube 110. Current I flows through electromagnetic coils 101 and generates an additional magnetic field $B_{gen}$ within the x-ray tube 110 to oppose, i.e., substantially canceling or eliminating the effects of, the component of the static magnetic field perpendicular to the tube axis. Optimal steering of the electron beam on the target is provided when the net magnetic field in the x-ray tube is directed along the x-ray tube axis, i.e., when the component of the magnetic field perpendicular to the tube axis is zero. The current I in the coils 101 is selected so that the sum of the coil magnetic field $B_{gen}$ and the static magnetic field $B_o$ is directed only along the x-ray tube axis. For example, as shown in FIG. 4, electromagnetic coils 101 create a magnetic field $B_{gen}$ that adds to the external magnetic field $B_o$ to produce a net magnetic field $B_{net}$ within the x-ray tube, parallel to the x-ray tube axis. Of course, electromagnetic coils 101 ideally affect primarily the magnetic field locally, i.e., in the x-ray tube. The direction of the additional magnetic field can be reversed by reversing the direction of the current I in electromagnetic coils 101. To have the full ability to generate transverse fields in any direction, additional electromagnetic coils are needed. For example, the system could use a pair such as electromagnetic coils 101 shown in FIG. 4 to generate a transverse field in one direction, and another pair (not shown), rotated by 90°, to generate a transverse field rotated by 90°. Other arrangements of electromagnetic coils, capable of generating a magnetic field in an arbitrary direction perpendicular to the anode-cathode axis, can be implemented without departing from the scope of the present invention.

Figure 7:
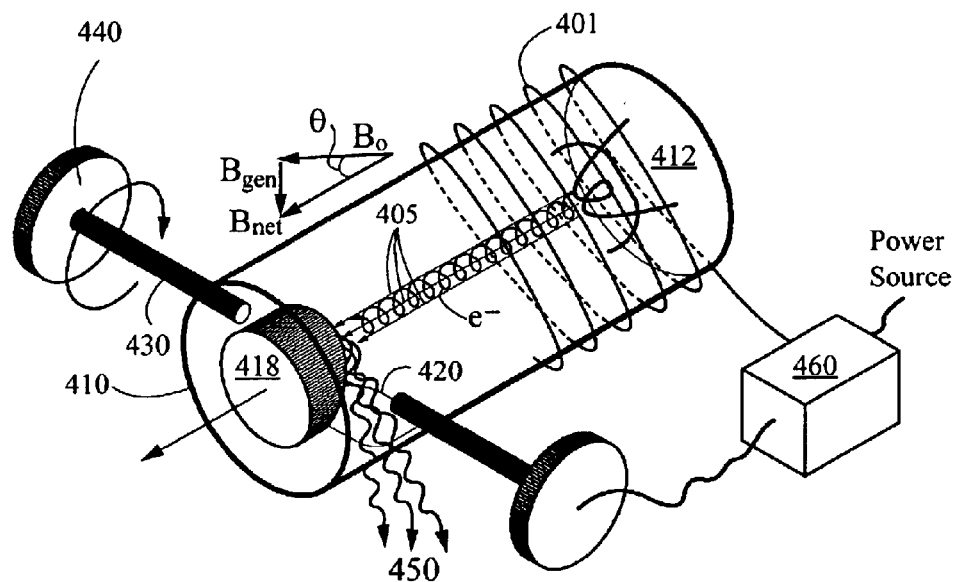
FIG. 7 is a schematic diagram of an x-ray source according to an embodiment of the invention.

In this system, a controller, such as controlling means 460 shown in FIG. 7, is provided to deliver the required current I to produce a net magnetic field $B_{net}$ aligned with the x-ray tube axis, depending upon the relative orientation of the x-ray tube and the magnitude and direction of $B_o$. With this system operational, the x-ray system can be rotated to achieve the desired projection while maintaining the desired location of the focal spot 115 on the target 118.

The current required to oppose the undesired transverse field needs to be determined. This can be done during a calibration and stored for later use, or a feedback system can be employed. Additionally, one or more magnetic field sensors (not shown) such as Hall effect probes can be used to detect the transverse magnetic fields.

For x-ray image acquisition applications, a feedback system is preferred to allow automatic and appropriate choice of current being supplied to the magnetic field generating means, e.g., electromagnetic coils 101. One such feedback system consists of two components: the first part is a sensor that measures a quantity related to the amount of additional correction needed; the second part uses the information obtained from the first part to modify the current, thereby changing the location of the focal spot and providing dynamic steering. Possible sensor implementations have been discussed in the above referenced co-pending application Ser. No. 10/259,225, incorporated herein by reference, and thus will not be further described herein. The second component of the feedback system uses a standard controller to modify the current or potential as determined by the information acquired from the first component. It will be apparent to a person of average skill in the art how to implement such a controller.

Figure 5:
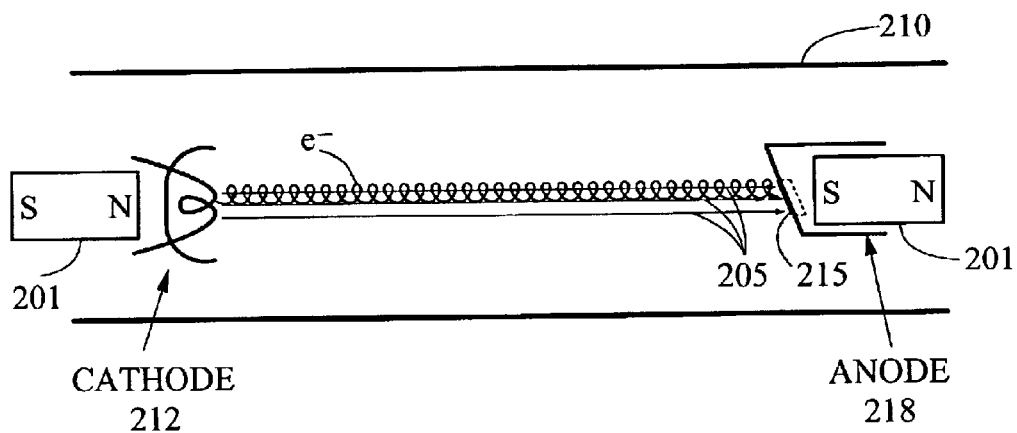
FIG. 5 is a schematic diagram of another x-ray source of the apparatus of FIG. 3.

The x-ray source 200 shown in FIG. 5 requires no additional input during system operation. As shown in FIG. 5, a magnetic field generating means such as permanent magnets 201 are positioned in the x-ray source 210 so to distort the magnetic field in a desired manner. Specifically, the magnetic field is distorted locally to improve the steering of the electron beam towards the target 215.

In this embodiment, permanent magnets 201 are positioned behind cathode 212 and anode 218, respectively, inside x-ray tube 210 such that a strong magnetic field is generated between the anode and the cathode in the anode-cathode direction. This strong magnetic field has magnetic field lines, e.g., lines 205, passing from cathode 212 to anode 218. The radius with which an electron spirals around a magnetic field line that it is on, such as one shown in FIG. 5, is governed by the Larmor equation:

$R = (mv)/(eB)$, where m is the mass of the electron, v is the magnitude of the component of the electron velocity perpendicular to B, e is the electron charge, and B is the magnitude of the magnetic field line in interest. Note that since the electron is accelerating in the cathode-anode direction, the spiral path will in practice have an increasing pitch (distance of travel per revolution). That is, as the electrons accelerate they will travel farther in successive 360° rotations about the magnetic field line.

The strong internal magnetic field produced by the permanent magnets causes the x-ray tube to be less sensitive to other magnetic fields that are not parallel to the anode-cathode axis. Since the strong internal magnetic field is properly aligned to the x-ray tube axis, this reduces the effect of other misaligned magnetic fields, thereby improving the behavior of an x-ray tube whose alignment with the external magnetic field is imperfect.

Figure 6:
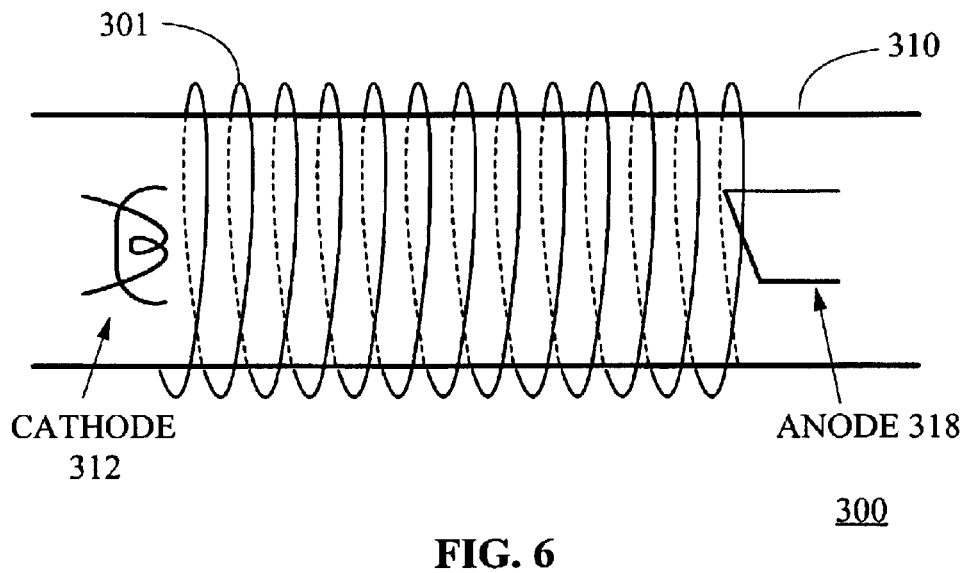
FIG. 6 is a schematic diagram of yet another x-ray source of the apparatus of FIG. 3.

This same effect can be achieved using an electromagnetic winding instead of permanent magnets. For example, as shown in FIG. 6, the x-ray source 300 comprises a solenoid coil 301 positioned around the x-ray tube 310, with the current and number of turns designed to produce a strong magnetic field between anode 318 and cathode 312 in the anode-cathode direction. Since the magnetic field produced inside the solenoid increases as the radius of the coil decreases, one may want to place the electromagnetic coil inside the x-ray tube envelope. This may be difficult, however, due to the strong electric field and the possibility of arcing. A Helmholtz coil could also be used. In any case, the goal of this electromagnet is the same as the goal of the permanent magnets of FIG. 5, i.e., to produce a strong, relatively homogeneous magnetic field in the anode-cathode direction in the gap between the anode and the cathode.

In these exemplary embodiments, there are two magnetic fields, one caused by the magnetic field generating means 101, 201 or 301, i.e., the "internal magnetic field," and another one which would be present in the ambient environment without the presence of the x-ray tube 110, 210, or 310, respectively, hereinafter referred to as the "external magnetic field." In each example, a net magnetic field, created by both the internal and external magnetic fields, acts on the electrons in the x-ray tube. While the use of the permanent magnets 201 or solenoid 301 improves the system performance, there may remain some significant effects from the external magnetic field because the internal magnetic field produced by the permanent magnets does not operate to cancel or otherwise completely eliminate the transverse component of the external magnetic field. As such, unless the transverse component is cancelled by means such as electromagnetic coils, e.g., electromagnetic coils 101, the net magnetic field is not likely to be parallel to the anode-cathode axis. This is especially so if the external magnetic field is comparable to or stronger than the internal magnetic field produced by the added permanent magnets or electromagnet. It is apparent that the x-ray tube would operate better if the anode-cathode axis were aligned with the net magnetic field.

We recognize that, in the presence of the external magnetic field, especially one that is comparable to or stronger than the internal magnetic field produced by the added permanent magnets or electromagnet that are coupled to the x-ray tube, the x-ray tube will experience a torque that will attempt to align the x-ray tube itself with the external magnetic field. The present invention solves this problem by letting the x-ray tube align itself with a novel mounting arrangement. That is, the x-ray tube is mounted in a manner that it can pivot, allowing it to move and align itself, as shown in FIG. 7. X-ray tube 410 is attached to an axis 430, which allows the tube to rotate in the direction of the arrow. X-ray tube 410 has internal magnets (not shown) or an electromagnet 401 to create an aligned internal field $B_{gen}$ having magnetic field lines 405 passing from cathode 412 to anode 418. X-rays 450 generated at the target of anode 418 exit the x-ray tube 410 through an x-ray transparent window 420 and are directed toward an object (not shown) being imaged. Mounting on axis 430 will allow the tube to pivot in the presence of a transverse field in one direction (vertical in FIG. 7), and align itself with the net field $B_{net}$. This assembly can in turn be mounted on another axis (not shown) allowing rotation in the other direction (horizontal in FIG. 7), thereby allowing the tube to align itself with an arbitrary external field.

In this embodiment, the amount of motion that can be tolerated will depend on the application, but generally a rotation of the x-ray tube of about 5–15 degrees may be acceptable. Ideally, the mounting of the x-ray tube 410 within the x-ray source 400 housing (not shown) would allow the x-ray tube 410 to pivot about the focal spot on the anode 418, thereby maintaining the alignment of the x-ray focal spot within the x-ray system.

In some cases, it may not be possible to let the x-ray tube rotate into full alignment. According to another embodiment of the present invention, this problem is solved by mounting the x-ray tube in such a way that the torque it experiences, or at least the direction of the torque, can be sensed by one or more sensors. The sensed mechanical force is then used as an input for determining the amount of current to be applied to the magnetic field generating means to oppose the torque sensed. For example, as shown in FIG. 7, axis 430 is coupled to mechanical sensors 440. In the presence of an external magnetic field $B_o$ that is not aligned with the internal magnetic field $B_{gen}$ produced by the electromagnetic coil 401, which is coupled to the x-ray tube, the x-ray tube experiences a torque that attempts to align the x-ray tube with $B_o$. The mechanical force experienced by the x-ray tube is detected by sensors 440 and communicated to a controlling means 460. The controlling means 460 then determines, based on the sensed mechanical force, the amount of additional current to be applied to electromagnetic coils 401. This way, when a torque is sensed, the current supplied to electromagnetic coil 401 is altered in a way to oppose the unwanted transverse magnetic field, thereby opposing the torque. When the transverse field is zero, the x-ray tube 410 will experience no torque. This feedback process, which can occur in essentially real time, ideally continues until the sensed torque is effectively zero.

It will be clear to one skilled in the art that the above embodiments may be altered in many ways without departing from the scope of the invention. Many aspects of the present invention described herein can be combined in several ways to further improve the alignment of electric and magnetic fields of the x-ray tube in the anode-cathode direction. For example, an ideal hybrid x-ray/MR imaging system may include a variety of sensing means such as infrared sensor(s), magnetic field sensor(s), torque sensor(s), or a combination thereof. The x-ray source of the system may include a magnetic material, such as permanent magnets 201 for passively and locally affecting the magnetic field in a desired manner; it may include electromagnetic coils, such as coils 101, 301, or 401, for real time active cancellation of component(s) of any magnetic field that is perpendicular to the anode-cathode axis; or it may include a combination of these means to affect/steer magnetic field(s)

to be parallel to the anode-cathode axis of the x-ray tube or otherwise cancel or significantly reduce the effects of the undesired magnetic field so that the x-ray tube can be operated in the hybrid x-ray/MR imaging system without being affected by the high static magnetic field of the MRI. As is apparent to one skilled in the art, the feedback system for determining appropriate current based on the sensed input as well as the controller described herein can be implemented in various ways without departing from the spirit of the invention. Accordingly, the scope of the invention should be determined by the following claims and their legal equivalents.

What is claimed is:

1. An x-ray source for imaging, said x-ray source comprising:
    a housing;
    an x-ray tube residing in said housing, said x-ray tube having an anode and a cathode positioned along an axis, wherein said x-ray tube is disposed in an external magnetic field, and wherein electrons travel from said cathode to said anode; and
    a magnetic means for producing an internal magnetic field between said cathode and said anode, said internal magnetic field having a component in a direction of said axis, wherein a net magnetic field produced by said internal and external magnetic fields has a component along said axis.

2. The x-ray source of claim 1, wherein said x-ray source is in proximity to a magnetic resonance system.

3. The x-ray source of claim 1, wherein said magnetic means comprises at least one permanent magnet.

4. The x-ray source of claim 1, wherein said magnetic means comprises a first permanent magnet positioned adjacent said anode and a second permanent magnet positioned adjacent said cathode.

5. The x-ray source of claim 1, wherein said magnetic means comprises an electromagnet.

6. The x-ray source of claim 5, wherein said electromagnet is a solenoid wrapping around said x-ray tube with current and number of wrapping turns designed to produce said internal magnetic field substantially along said axis.

7. The x-ray source of claim 1, further comprising: a torque sensing means for sensing a torque or a direction of said torque experienced by said x-ray tube.

8. The x-ray source of claim 7, further comprising:
    a second magnetic means for producing a second internal magnetic field substantially perpendicular to said axis; and
    a means for receiving input from said torque sensing means and for affecting said second magnetic means in a way to oppose said torque.

9. The x-ray source of claim 1, wherein said magnetic means is attached to said x-ray tube, and wherein said x-ray tube experiences a torque due to said external magnetic field when said axis is not aligned with said external magnetic field.

10. The x-ray source of claim 9, further comprising: a mounting arrangement for allowing said x-ray tube to self-align.

11. The x-ray source of claim 10, wherein said electrons strike said anode at a focal spot, said mounting arrangement defining a pivot axis for pivoting said x-ray tube about said focal spot.

12. The x-ray source of claim 10, wherein said mounting arrangement further comprises a limiting means for limiting pivoting of said x-ray tube to a maximum of about 5–15 degrees.

13. The x-ray source of claim 10, wherein said mounting arrangement comprises
    a first axis for allowing said x-ray tube to rotate in a first direction and
    a second axis for allowing said x-ray tube to rotate in a second direction,
    thereby allowing said x-ray tube to align itself with said external magnetic field.

14. An x-ray source for imaging said x-ray source comprising:
    an x-ray tube having an anode and a cathode positioned along an axis, wherein said x-ray tube is disposed in an external magnetic field, and wherein electrons travel from said cathode to strike said anode at a focal spot; and
    a magnetic means attached to said x-ray tube for producing an internal magnetic field substantially in a direction of said axis and between said cathode and said anode, wherein a net magnetic field produced by said internal and external magnetic fields has a component along said axis.

15. The x-ray source of claim 14, wherein said magnetic means comprises at least one permanent magnet.

16. The x-ray source of claim 14, wherein said magnetic means comprises a first permanent magnet positioned adjacent said anode and a second permanent magnet positioned adjacent said cathode.

17. The x-ray source of claim 14, wherein said magnetic means comprises an electromagnet.

18. The x-ray source of claim 17, wherein said electromagnet is a solenoid wrapping around said x-ray tube with current and number of wrapping turns designed to produce said internal magnetic field substantially along said axis.

19. The x-ray source of claim 14, further comprising: a torque sensing means for sensing a torque or a direction of said torque experienced by said x-ray tube.

20. The x-ray source of claim 19, further comprising:
    a second magnetic means for producing a second internal magnetic field substantially perpendicular to said axis; and
    a means for receiving input from said torque sensing means and for affecting said second magnetic means in a way to oppose said torque.

21. The x-ray source of claim 14, further comprising: a mounting arrangement for mounting said x-ray tube in a manner that allows said x-ray tube to pivot about said focal spot.

22. The x-ray source of claim 21, wherein said mounting arrangement further comprises a limiting means for limiting pivoting of said x-ray tube to about 5–15 degrees.

23. The x-ray source of claim 14, further including a mounting arrangement comprising
    a first axis for allowing said x-ray tube to rotate in a first direction and
    a second axis for allowing said x-ray tube to rotate in a second direction,
    thereby allowing said x-ray tube to align itself with an arbitrary external magnetic field.

24. The x-ray source of claim 14, wherein said x-ray source is in proximity to a magnetic resonance system.

* * * * *